United States Patent
Nam et al.

(10) Patent No.: US 10,829,577 B2
(45) Date of Patent: Nov. 10, 2020

(54) PHOTOCURED COMPOSITION, BLOCKING LAYER COMPRISING SAME AND ENCAPSULATED DEVICE COMPRISING SAME

(71) Applicant: CHEIL INDUSTRIES, INC., Gumi-si (KR)

(72) Inventors: Seong Ryong Nam, Uiwang-si (KR); Seung Jib Choi, Uiwang-si (KR); Ji Hye Kwon, Uiwang-si (KR); Yeon Soo Lee, Uiwang-si (KR); Ji Yeon Lee, Uiwang-si (KR); Chang Min Lee, Uiwang-si (KR)

(73) Assignee: CHEIL INDUSTRIES, INC., Gumi-si (KR)

( * ) Notice: Subject to any disclaimer, the term of this patent is extended or adjusted under 35 U.S.C. 154(b) by 281 days.

(21) Appl. No.: 14/758,670

(22) PCT Filed: May 28, 2013

(86) PCT No.: PCT/KR2013/004627
§ 371 (c)(1),
(2) Date: Jun. 30, 2015

(87) PCT Pub. No.: WO2014/106972
PCT Pub. Date: Jul. 10, 2014

(65) Prior Publication Data
US 2015/0337065 A1  Nov. 26, 2015

(30) Foreign Application Priority Data
Jan. 2, 2013 (KR) .................. 10-2013-0000404

(51) Int. Cl.
*C08F 222/10* (2006.01)
*C09D 135/02* (2006.01)
(Continued)

(52) U.S. Cl.
CPC ...... *C08F 222/1006* (2013.01); *C08F 220/36* (2013.01); *C08K 3/10* (2013.01);
(Continued)

(58) Field of Classification Search
CPC combination set(s) only.
See application file for complete search history.

(56) References Cited

U.S. PATENT DOCUMENTS 4,780,488 A * 10/1988 Su ..................... C08G 65/02
523/106
5,162,530 A * 11/1992 Molock ................. C08F 8/00
544/301
(Continued)

FOREIGN PATENT DOCUMENTS

JP  2009-018569 A  1/2009
JP  2010-030286 A  2/2010
(Continued)

Primary Examiner — Jennifer A Chriss
Assistant Examiner — Sean M DeGuire
(74) Attorney, Agent, or Firm — Lee IP Law, P.C.

(57) ABSTRACT

The present invention relates to a photocured composition comprising (A) a photocurable monomer and (B) a monomer of chemical formula 1, a blocking layer comprising the same, and an encapsulated device comprising the same.

13 Claims, 1 Drawing Sheet

(51) Int. Cl.

| | |
|---|---|
| *H01L 51/00* | (2006.01) |
| *H01L 51/52* | (2006.01) |
| *H01L 31/0203* | (2014.01) |
| *C08L 33/14* | (2006.01) |
| *C08F 220/36* | (2006.01) |
| *H01L 23/31* | (2006.01) |
| *H01L 23/29* | (2006.01) |
| *C09J 4/00* | (2006.01) |
| *H01L 31/048* | (2014.01) |
| *C08K 3/10* | (2018.01) |

(52) U.S. Cl.
CPC ............ *C08L 33/14* (2013.01); *C09D 135/02* (2013.01); *C09J 4/00* (2013.01); *H01L 23/293* (2013.01); *H01L 23/3121* (2013.01); *H01L 23/3135* (2013.01); *H01L 31/0203* (2013.01); *H01L 31/0481* (2013.01); *H01L 51/0035* (2013.01); *H01L 51/0043* (2013.01); *H01L 51/5237* (2013.01); *H01L 51/5253* (2013.01); *C08F 220/365* (2020.02); *C08F 222/102* (2020.02); *H01L 2924/0002* (2013.01); *Y02E 10/50* (2013.01); *Y10T 428/2495* (2015.01); *Y10T 428/31667* (2015.04); *Y10T 428/31699* (2015.04); *Y10T 428/31935* (2015.04)

(56) References Cited

U.S. PATENT DOCUMENTS

| | | | |
|---|---|---|---|
| 7,767,498 B2 | 8/2010 | Moro et al. | |
| 2007/0216743 A1* | 9/2007 | Makuta | C09D 11/40 347/100 |
| 2008/0076043 A1* | 3/2008 | Mori | G03F 7/0007 430/7 |

FOREIGN PATENT DOCUMENTS

| | | | | |
|---|---|---|---|---|
| JP | 2012-086387 A | 5/2012 | | |
| KR | 2011-0072930 A | 6/2011 | | |
| KR | 2012-0077643 A | 7/2012 | | |
| WO | WO 2011085280 A1 * | 7/2011 | ............ | C08F 12/22 |

* cited by examiner

【FIG 1】
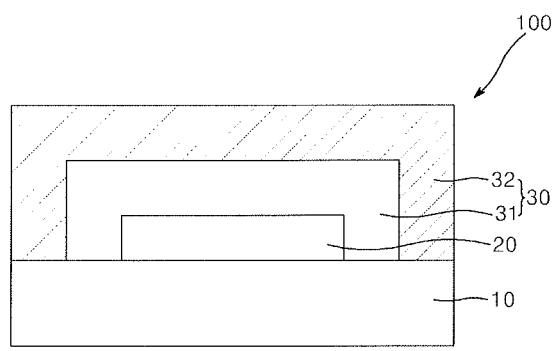
【FIG 2】
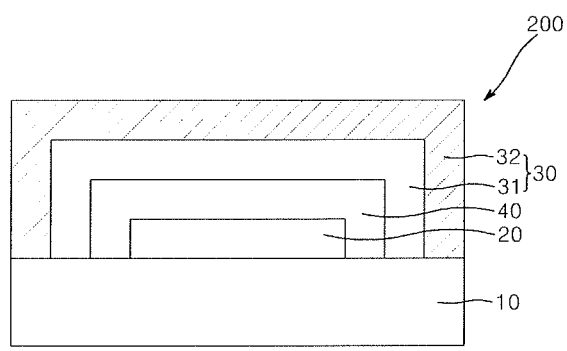

PHOTOCURED COMPOSITION, BLOCKING LAYER COMPRISING SAME AND ENCAPSULATED DEVICE COMPRISING SAME

CROSS REFERENCE TO RELATED APPLICATIONS

This is the U.S. national phase application based on PCT Application No. PCT/KR2013/004627, filed May 28, 2013, which is based on Korean Patent Application No. 10-2013-0000404, filed Jan. 2, 2013, the entire contents of all of which are hereby incorporated by reference.

TECHNICAL FIELD

The present invention relates to a photocurable composition, a barrier layer including the same, and an encapsulated apparatus including the same.

BACKGROUND ART

Organic optoelectronic devices such as organic light emitting diodes, devices including photovoltaic cells, and displays such as organic thin film transistors must be encapsulated to protect sensitive components thereof from gases in air (mainly oxygen and/or moisture). Improper protection can cause deterioration in quality of the devices. In addition, this can cause occurrence of non radial dark spots, which also leads to device degradation. In particular, in an organic light emitting diode, water vapor can cause degradation of the diode and deterioration in quality of an interface between an anode (or cathode) and an organic film.

Encapsulation can be typically achieved by bonding a glass cap to a display using specific adhesives, particularly adhesives having low water vapor transmission rate. Generally, to extend lifespan of devices, a solid moisture getter may be interposed between a substrate and a cap. Encapsulation using the cap is suitable for rigid devices but is not suited for devices including a flexible support (for example, flexible displays).

Such an encapsulation technique is not feasible when a circuit of a substrate does not have a sufficient space, as in a complementary metal-oxide semiconductor (CMOS) micro-display. Particularly, in order to achieve light weight, application of this technique must be avoided for a device having a large emission area.

In all cases for which encapsulation using a cap is unsuitable, "monolithic" encapsulation, i.e. encapsulation using a thin film having excellent oxygen barrier and water vapor barrier properties, is generally used. Examples of most common materials for monolithic encapsulation may include oxide dielectrics/nitrides, which are represented by $SiO_x$, $SiN_x$, $SiO_xN_y$, and $Al_xO_y$, generally deposited using chemical vapor deposition (CVD), and optionally using plasma-enhanced chemical vapor deposition (PECVD) or atomic layer deposition (ALD). The aforementioned methods may be preferable than physical vapor deposition (PVD) such as sputtering, which is aggressive to organic semiconductors, thereby causing formation of an undesired film on coating of a encapsulation film due to defects such as pinholes produced in the deposited film. Deposited films obtained by plasma-enhanced chemical vapor deposition or atomic layer deposition have fewer defects than films obtained by physical vapor deposition and are very uniform. In other words, these two methods can provide excellent step coverage.

"To avoid association" of defects of an inorganic layer with other inorganic layers, there has been, for example, an effort to manufacture a multilayer barrier of organic layer/inorganic layer/organic layer/inorganic layer, which is referred to as Barix. This method can reduce water vapor transmission rate to about $10 \ g^{-6}/m^2/day$ and thus provide sufficient lifespan to allow commercialization of organic light emitting diode displays.

Another typical example of multilayer encapsulation structures includes "NONON" by Philips Electronics, which is a multilayer including a nitride layer and an oxide layer alternately stacked one above another, such as $SiN_x/SiO_x/SiN_x/SiO_x$.

U.S. Pat. No. 7,767,498 reported that depositing 5 acrylic organic layers and 5 inorganic layers were obtained through vacuum deposition. A water vapor permeability of about $10^{-6} g/m^2/day$ could be obtained. However, in the structure formed by stacking the organic layers, since the organic layers are composed of an organic material having no barrier properties, a cathode layer suffers from corrosion due to water penetration, which causes light emission failure, which results in deterioration in reliability. In addition, in this structure including 10 deposited layers, if the organic layer does not have a sufficient thickness, the organic layer suffers from deterioration in smoothness when deposited on the inorganic layer. Further, if aluminum oxide, which has good barrier characteristics, is used alone, pin-holes having been produced upon deposition continue to grow even when layer thickness is increased, thereby allowing easy penetration of water and oxygen therethrough. This can cause deterioration in adhesion between organic and inorganic layers and thus degradation of water barrier properties.

DISCLOSURE

Technical Problem

It is an aspect of the present invention to provide a photocurable composition capable of forming a barrier layer encapsulating an apparatus susceptible to an environment.

It is another aspect of the present invention to provide a photocurable composition which has high photocuring rate, low curing shrinkage after curing, and high adhesion to an inorganic barrier layer, and thus can form a barrier layer for encapsulation.

It is a further aspect of the present invention to provide a barrier layer formed using the photocurable composition as set forth above, a barrier stack including the same, an encapsulated apparatus including the same, and a method of encapsulating an apparatus using the same.

Technical Solution

In accordance with one aspect of the present invention, a photocurable composition may include (A) a photocurable monomer and (B) a monomer represented by Formula 1:

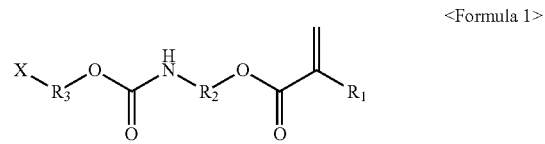

<Formula 1>

(wherein $R_1$, $R_2$, $R_3$, and X are the same as defined in the detailed description of the present invention).

X may be a $C_2$ to $C_{10}$ saturated or unsaturated cycloaliphatic hydrocarbon group or a $C_2$ to $C_{10}$ unsaturated aromatic hydrocarbon group, containing at least one of —O—,

—N|—,

—NR—, —S—, —N=, —O$^+$=, —S$^+$=, —O$^+$R—, —S$^+$R—, —(C=O)—, —(C=S)—, —(C=O)O—, —O(C=O)O—, —NR(C=O)—,

—N|—(C=O)—,

—NR(C=O)NR—,

—C(=O)—N|—C(=O)—,

—NH—CH=CH—(C=O)—, —O—CH=N—(C=O)—, —NH—N=CH—(C=O)—, —(C=O)—NH—N=, —O—N=CH—(C=O)—, and —S—CH=N—(C=O)— (where R being hydrogen or a $C_1$ to $C_{10}$ alkyl group, and "—" being an intermolecular binding site).

X may be a lactone group, a morpholine group, a pyrrolidone group, a phthalimide group, or a succinimide group.

The monomer (B) may be represented by any one of Formulas 2 to 6:

<Formula 2>

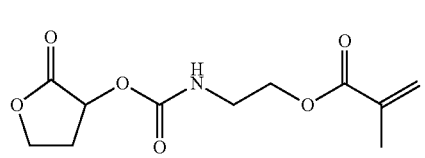

<Formula 3>

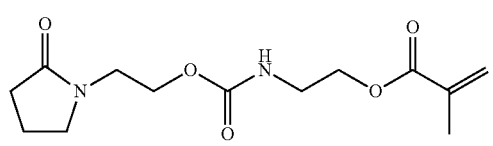

<Formula 4>

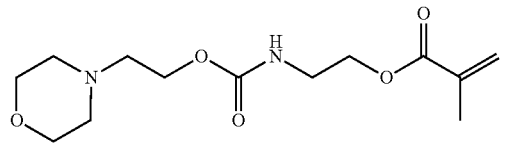

<Formula 5>

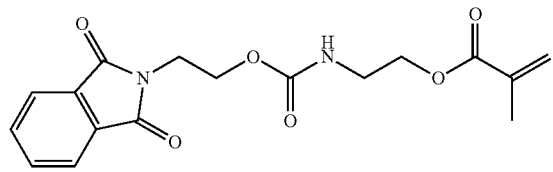

<Formula 6>

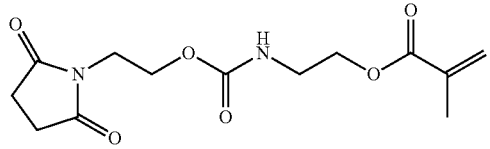

The photocurable monomer may include a monomer containing about 1 to 30, vinyl groups, acrylate groups, or methacrylate groups.

The photocurable monomer (A) may include at least one of (meth)acrylates containing $C_1$ to $C_{20}$ alkyl group, di(meth)acrylates of $C_2$ to $C_{20}$ diol, tri(meth)acrylates of $C_3$ to $C_{20}$ triol, and tetra(meth)acrylates of $C_4$ to $C_{20}$ tetraol.

The photocurable composition may further include (C) an initiator.

The initiator (C) may include photo initiator.

The photocurable composition may include about 20 wt% to about 90 wt% of the (A) monomer; about 1 wt% to about 60 wt% of the (B) monomer; and about 0.1 wt% to about 20 wt% of the (C) initiator, in terms of solid content.

In accordance with another aspect of the invention, a barrier layer may include a cured product of the photocurable composition as set forth above.

In accordance with a further aspect of the invention, an encapsulated apparatus may include a member for the apparatus and a barrier stack formed on the member for the apparatus and including an inorganic barrier layer and an organic barrier layer, wherein the organic barrier layer may include a cured product of the photocurable composition as set forth above.

The organic barrier layer may have an adhesive strength to the inorganic barrier layer of about 20 kgf/(mm)$^2$ to about 100 kgf/(mm)$^2$.

The inorganic barrier layer may include metals. metal oxides, metal nitrides. metal carbides, metal oxynitrides, metal oxyborides, or mixtures thereof, and the metal may include at least one of silicon (Si), aluminum (Al), selenium (Se), zinc (Zn), antimony (Sb), indium (In), germanium (Ge), tin (Sn), bismuth (Bi), transition metals, and lanthanide metals.

The organic barrier layer and the inorganic barrier layer may be alternately formed.

The inorganic barrier layers and organic barrier layers may be stacked in a total of 10 layers or less.

Each organic barrier layer may have a thickness of about 0.1 μm to about 20 μm, and each inorganic barrier layer may have a thickness of about 5 nm to about 500 nm.

The member for the apparatus may include flexible organic light emitting devices, organic light emitting devices, illumination devices, metal sensor pads, microdisc lasers, electrochromic devices, photochromic devices, microelectromechanical systems, solar cells, integrated circuits, charge coupled devices, light emitting polymers, or light emitting diodes.

Advantageous Effects

The present invention provides a photocurable composition which has high photocuring rate, low curing shrinkage after curing, and high adhesion to an inorganic barrier layer, and thus can form a barrier layer having high reliability.

DESCRIPTION OF DRAWINGS

FIG. 1 is a cross-sectional view of an encapsulated apparatus according to one embodiment of the present invention.

FIG. 2 is a cross-sectional view of an encapsulated apparatus according to another embodiment of the present invention.

BEST MODE

As used herein, unless otherwise stated, the term 'substituted' in the phrase 'substituted or unsubstituted' means that at least one hydrogen atom of functional groups of the present invention is substituted with a halogen atom (F, Cl, Br or I), a hydroxyl group, a nitro group, a cyano group, an imino group (=NH, =NR, where R is a $C_1$ to $C_{10}$ alkyl group), an amino group (—$NH_2$, —NH(R'), —N(R")(R'''), where R', R" and R''' are each independently a $C_1$ to $C_{10}$ alkyl group), a $C_1$ to $C_{20}$ alkyl group, a $C_6$ to $C_{20}$ aryl group, a $C_3$ to $C_{10}$ cycloalkyl group, a $C_3$ to $C_{20}$ heteroaryl group, a $C_2$ to $C_{30}$ heterocycloalkyl group, or a $C_7$ to $C_{21}$ arylalkyl group.

As used herein, the term 'heterocycle' may refer to a $C_2$ to $C_{20}$ saturated or unsaturated heterocycloaliphatic group containing a hetero atom or a $C_2$ to $C_{20}$ heteroaromatic group containing a hetero atom, and the term 'hetero atom' may refer to nitrogen, oxygen, or sulfur.

In accordance with one aspect of the present invention, a photocurable composition may include (A) a photocurable monomer and (B) a monomer containing heterocycle or an oligomer thereof.

(A) Photocurable Monomer

The photocurable monomer is a non-heterocycloaliphatic monomer containing no heterocycloaliphatic group or a non-heteroaromatic monomer containing no heteroaromatic group, and may refer to a monomer containing a photocurable functional group. Here, the photocurable functional group may be a (meth)acrylate group, a vinyl group, and the like.

The photocurable monomer may include a monofunctional monomer, a polyfunctional monomer, or a combination thereof. For example, the photocurable monomer may include a monomer containing about 1 to 30, for example, about 1 to 20, for example, about 1 to 6, substituted or unsubstituted vinyl groups, substituted or unsubstituted acrylate groups, or substituted or unsubstituted methacrylate groups.

The photocurable monomer may include a mixture of a monofunctional monomer and a polyfunctional monomer. In the mixture, the monofunctional monomer and the polyfunctional monomer may be present in a weight ratio of about 1:0.1 to about 1:10, for example, about 1:1 to about 1:7, for example, about 1:2 to about 1:5.

In some embodiments, the photocurable monomer may include $C_6$ to $C_{20}$ aromatic compounds having a substituted or unsubstituted vinyl group; unsaturated carboxylic acid esters having a $C_1$ to $C_{20}$ alkyl group, a $C_3$ to $C_{20}$ cycloalkyl group, a $C_6$ to $C_{20}$ aromatic group, or a hydroxyl group and a $C_1$ to $C_{20}$ alkyl group; unsaturated carboxylic acid esters having a $C_1$ to $C_{20}$ aminoalkyl group; vinyl esters of $C_1$ to $C_{20}$ saturated or unsaturated carboxylic acids; $C_1$ to $C_{20}$ unsaturated carboxylic acid glycidyl esters; vinyl cyanide compounds; unsaturated amide compounds; monofunctional or polyfunctional (meth)acrylates of monohydric or polyhydric alcohols, and the like. The term 'polyhydric alcohol' refers to alcohols containing about 2 or more, for example, about 2 to 20, for example, about 2 to 10, for example, about 2 to 6 hydroxyl groups.

In some embodiments, the photocurable monomer may include $C_6$ to $C_{20}$ aromatic compounds containing an alkenyl group including a vinyl group, such as styrene, alpha-methyl styrene, vinyl toluene, vinyl benzyl ether, and vinyl benzyl methyl ether; unsaturated carboxylic acid esters such as methyl (meth)acrylate, ethyl (meth)acrylate, butyl (meth)acrylate, 2-hydroxyethyl (meth)acrylate, 2-hydroxybutyl (meth)acrylate, hexyl (meth)acrylate, octyl (meth)acrylate, nonyl (meth)acrylate, decanyl (meth)acrylate, undecanyl (meth)acrylate, dodecyl (meth)acrylate, cyclohexyl (meth)acrylate, benzyl (meth)acrylate, phenyl (meth)acrylate, and the like; unsaturated carboxylic acid aminoalkyl esters, such as 2-aminoethyl (meth)acrylate, 2-dimethylaminoethyl (meth)acrylate, and the like; saturated or unsaturated carboxylic acid vinyl esters, such as vinyl acetate, vinyl benzoate, and the like; unsaturated $C_1$ to $C_{20}$ carboxylic acid glycidyl esters, such as glycidyl (meth)acrylate; vinyl cyanide compounds, such as (meth)acrylonitrile; unsaturated amide compounds, such as (meth)acrylamide; and monofunctional or polyfunctional (meth)acrylates of monohydric or polyhydric alcohols including ethyleneglycol di(meth)acrylate, triethyleneglycol di(meth)acrylate, trimethylolpropane tri(meth)acrylate, 1,4-butanediol di(meth)acrylate, 1,6-hexanediol di(meth)acrylate, octanediol di(meth)acrylate, nonanediol di(meth)acrylate, decanediol di(meth)acrylate, undecanediol di(meth)acrylate, dodecanediol di(meth)acrylate, neopentylglycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol tetra(meth)acrylate, dipentaerythritol penta(meth)acrylate, dipentaerythritol hexa(meth)acrylate, bisphenol A di(meth)acrylate, novolac epoxy (meth)acrylate, diethyleneglycol di(meth)acrylate, tri(propyleneglycol) di(meth)acrylate, and poly(propylene glycol) di(meth)acrylate, and the like, without being limited thereto.

For example, the photocurable monomer may include at least one of (meth)acrylates containing $C_1$ to $C_{20}$ alkyl group, di(meth)acrylates of $C_2$ to $C_{20}$ diol, tri(meth)acrylates of $C_3$ to $C_{20}$ triol, and tetra(meth)acrylates of $C_4$ to $C_{20}$ tetraol.

The photocurable monomer may be included in an amount of about 20% by weight (wt %) to about 90wt %, for example, about 60 wt % to about 90 wt %, for example, about 70 wt % to about 90 wt %, in terms of solid content. Within this range, the composition can enhance adhesion between an organic layer and inorganic layer in manufacture of a thin film encapsulation layer, thereby reducing or preventing outgassing and water vapor transmission rate.

(B) Monomer Containing Heterocycle or an Oligomer Thereof

The monomer containing heterocycle or an oligomer thereof is included together with the photocurable monomer in the photocurable composition, enhances photocuring rate of the composition and adhesion to an inorganic barrier layer after curing, and can thus block penetration of water vapor and oxygen from outside, thereby improving reliability of a member for an apparatus.

The monomer containing heterocycle may be a photocurable monomer which contains a heterocycle and a photocurable functional group (for example, (meth)acrylate group, vinyl group etc.).

In one embodiment, the monomer containing heterocycle may be represented by Formula 1:

<Formula 1>

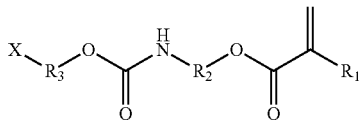

(wherein, $R_1$ is hydrogen or a substituted or unsubstituted $C_1$ to $C_{20}$ alkyl group, $R_2$ is a substituted or unsubstituted $C_1$ to $C_{30}$ alkylene group, a substituted or unsubstituted $C_6$ to $C_{30}$ arylene group, or a substituted or unsubstituted $C_5$ to $C_{20}$ cycloalkylene group, $R_3$ is a single bond, a substituted or unsubstituted $C_1$ to $C_{30}$ alkylene group, a substituted or unsubstituted $C_6$ to $C_{30}$ arylene group, or a substituted or unsubstituted $C_5$ to $C_{20}$ cycloalkylene group, and X is a $C_2$ to $C_{20}$ saturated or unsaturated cycloaliphatic hydrocarbon group containing a hetero atom or a $C_2$ to $C_{20}$ unsaturated aromatic hydrocarbon group containing a hetero atom).

X may include at least one of —(C=O)— or —(C=S)—.

For example, X may be a $C_2$ to $C_{10}$ saturated or unsaturated cycloaliphatic hydrocarbon group containing a hetero atom or a $C_2$ to $C_{10}$ unsaturated aromatic hydrocarbon group containing a hetero atom.

For example, $R_2$ may be a $C_1$ to $C_5$ alkylene group.

For example, $R_3$ may be a single bond, or a $C_1$ to $C_5$ alkylene group.

For example, X may be a $C_2$ to $C_{10}$ saturated or unsaturated cycloaliphatic hydrocarbon group or a $C_2$ to $C_{10}$ unsaturated aromatic hydrocarbon group, containing at least one of —O—,

—NR—, —S—, —N=, —O⁺=, —S⁺=, —O⁺R—, —S⁺R—, —(C=O)—, —(C=S)—, —(C=O)O—, —O(C=O)O—, —NR(C=O)—,

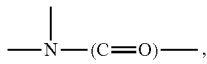

—NR(C=O)NR—,

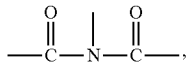

—NH—CH=CH—(C=O)—, —O—CH=N—(C=O)—, —NH—N=CH—(C=O)—, —(C=O)—NH—N=, —O—N=CH—(C=O)—, and —S—CH=N—(C=O)— (where R is hydrogen or a $C_1$ to $C_{10}$ alkyl group, and '—' is an intermolecular binding site).

X may be bonded to $R_3$ at any position (for example, carbon or nitrogen) constituting the cycloaliphatic group or aromatic hydrocarbon group.

For example, X may be a lactone group, a pyrrolidone group, a morpholine group, a phthalimide group, or a succinimide group.

The monomer containing heterocycle or the oligomer thereof may be prepared by any typical methods, or may be commercially available products.

In the composition, the monomer containing heterocycle or the oligomer thereof may be included in an amount of about 1 wt % to about 60 wt %, for example, about 1 wt % to about 30 wt %, for example, about 5 wt % to about 20 wt %, in terms of solid content. Within this range, the monomer can provide enhanced adhesion to an inorganic barrier layer after curing of the composition.

The composition may further include (C) an initiator.

(C) Initiator

The initiator may include any typical photo initiators capable of performing photocuring reaction without limitation. For example, the photo initiator may include triazine initiators, acetophenone initiators, benzophenone initiators, thioxanthone initiators, benzoin initiators, phosphorus initiators, oxime initiators, and mixtures thereof.

Examples of the triazine initiators may include 2,4,6-trichloro-s-triazine, 2-phenyl-4,6-bis(trich loromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, bis(trichloromethyl)-6-styryl-s-triazine, 2-(naphtho-1-yl)-4,6-bis(trichloromethyl)-s-triazine, 2-(4-methoxynaphtho-1-yl)-4,6-bis(trichloromethyl)-s-triazine, 2,4-trichloromethyl (piperonyl)-6-triazine, 2,4-(trichloromethyl(4'-methoxystyryl)-6-triazine, and mixtures thereof.

Examples of the acetophenone initiators may include 2,2'-diethoxyacetophenone, 2,2'-dibutoxyacetophenone, 2-hydroxy-2-methyl propiophenone, p-t-butyl trichloroacetophenone, p-t-butyl dichloroacetophenone, 4-chloroacetophenone, 2,2'-dichloro-4-phenoxyacetophenone, 2-methyl-1 -(4-(methylthio)phenyl)-2-morpholinopropan-1-one, 2-benzyl-2-dimethylamino- 1-(4-morpholinophenyl)-butan-1-one, and mixtures thereof.

Examples of the benzophenone initiators may include benzophenone, benzoyl benzoate, methyl benzoylbenzoate, 4-phenyl benzophenone, hydroxybenzophenone, acrylated benzophenone, 4,4'-bis(dimethylamino)benzophenone, 4,4'-dichlorobenzophenone, 3,3'-dimethyl-2-methoxybenzophenone, and mixtures thereof.

Examples of the thioxanthone initiators may include thioxanthone, 2-methyl thioxanthone, isopropyl thioxanthone, 2,4-diethylthioxanthone, 2,4-diisopropylthioxanthone, 2-chlorothioxanthone, and mixtures thereof.

Examples of the benzoin initiators may include benzoin, benzoin methyl ether, benzoin ethyl ether, benzoin isopropyl ether, benzoin isobutyl ether, benzyl dimethyl ketal, and mixtures thereof.

Examples of the phosphorus initiators may include bis-benzoylphenyl phosphine oxide, benzoyl(diphenyl) phosphine oxide, and mixtures thereof.

Examples of the oxime initiators may include 2-(o-benzoyloxime)-1-[4-(phenylthio)phenyl]-1,2-octanedione, 1-(o-acetyloxime)-1-[9-ethyl-6-(2-methylbenzoyl)-9H-carbazole-3-yl]ethanone, and mixtures thereof.

The initiator may be included in an amount of about 0.1 wt % to about 20 wt %, for example, about 0.5 wt % to about 10 wt %, for example, about 0.5 wt % to about 7 wt %, in the composition in terms of solid content. Within this range, the composition allows sufficient photopolymerization and can prevent deterioration in transmittance due to unreacted initiator remaining after photopolymerization.

The photocurable composition may be formed by mixing the photocurable monomer, the monomer containing heterocycle or an oligomer thereof, and the initiator. Preferably, the photocurable composition may be formed as a solvent-free photocurable composition.

The photocurable composition may have a photocuring rate of about 90% or higher. Within this range, the composition can realize a layer which does not suffer from a shift by virtue of low shrinkage stress after curing and thus can be used for device encapsulation. For example, the photocurable composition may have a photocuring rate of about 91% to about 97%.

The photocuring rate may be measured by any typical method. For example, the photocurable composition is applied to a glass substrate, followed by UV curing through UV irradiation at about 100 $J/cm^2$ for about 10 seconds. Then, the cured film is aliquoted, followed by measuring photocuring rate using FT-IR.

The photocurable composition may have a viscosity of about 10 cps to about 50 cps as measured at 25° C. Within this range, the composition can be coated to form a barrier layer.

The photocurable composition may have an adhesive strength to an inorganic barrier layer of about 20 $kgf/(mm)^2$ to about 100 $kgf/(mm)^2$ after curing. If the adhesive strength is less than about 20 $kgf/(mm)^2$, external water vapor or oxygen can easily permeate between an inorganic barrier layer and an organic barrier layer, thereby causing deterioration in reliability. If the adhesive strength is higher than about 100 $kgf/(mm)^2$, uniformity of an organic barrier layer can be deteriorated. The inorganic barrier layer may include an inorganic barrier layer as described in detail below (for example, silicon oxide, silicon nitride, aluminum oxide, etc.), without being limited thereto. For example, the photocurable composition may have an adhesive strength to an inorganic barrier layer of about 20 $kgf/(mm)^2$ to about 55 $kgf/(mm)^2$.

The photocurable composition may have a visible light transmittance of about 95% or higher after curing. Within this range, the photocurable composition can provide improved visibility when a display is encapsulated with the composition. Here, the light transmittance is measured at a wavelength of 550 nm. For example, the photocurable composition may have a visible light transmittance of about 95% to about 100%.

A member for an apparatus, particularly, a member for a display, can suffer from degradation or malfunction due to permeation of gas or liquid in a surrounding environment, for example, oxygen, moisture and/or water vapor, and due to permeation chemicals used in the preparation of electronic products. To prevent this problem, the member for an apparatus needs to be sealed or encapsulated.

Examples of the member for an apparatus may include organic light emitting diodes (OLED), illumination devices, flexible organic light emitting diode displays, metal sensor pads, microdisc lasers, electrochromic devices, photochromic devices, microelectromechanical systems, solar cells, integrated circuits, charge coupled devices, light emitting polymers, and light emitting diodes, without being limited thereto.

The photocurable composition according to the present invention provides desirable properties in terms of adhesive strength to an inorganic barrier layer, photocuring rate, and transmittance, and thus can form an organic barrier layer which is used for encapsulation of the apparatuses, particularly the flexible displays.

In accordance with another aspect of the invention, an organic barrier layer may be formed from the composition as set forth above.

The organic barrier layer may be formed by photocuring the photocurable composition. The photocurable composition may be coated to a thickness of about 0.1 μm to about 20 μm, followed by UV curing through UV irradiation at about 10 $mW/cm^2$ to about 500 $mW/cm^2$ for about 1 second to 50 seconds, without being limited thereto.

The organic barrier layer has the aforementioned properties after curing of the photocurable composition. Thus, the organic barrier layer can form a barrier stack together with an inorganic barrier layer as described below to be used for encapsulation of an apparatus.

In accordance with a further aspect of the present invention, a barrier stack may include the organic barrier layer and an inorganic barrier layer.

The inorganic barrier layer is formed of different materials than the organic barrier layer and thus can supplement effects of the organic barrier layer.

The inorganic barrier layer is not particularly limited so long as the inorganic barrier layer has good light transmittance and excellent barrier characteristics against water vapor and/or oxygen. For example, the inorganic barrier layer may be formed of metals, intermetallic compounds or alloys, oxides of metals or mixed metals, fluorides of metals or mixed metals, nitrides of metals or mixed metals, metal carbides, oxynitrides of metals or mixed metals, borides of metals or mixed metals, oxyborides of metals or mixed metals, silicides of metals or mixed metals, or combinations thereof. The metals may include silicon (Si), aluminum (Al), selenium (Se), zinc (Zn), antimony (Sb), indium (In), germanium (Ge), tin (Sn), bismuth (Bi), transition metals, and lanthanide metals, without being limited thereto. Specifically, the inorganic barrier layer may be silicon oxide, silicon nitride, silicon oxynitride, ZnSe, ZnO, $Sb_2O_3$, $Al_2O_3$, $In_2O_3$, or $SnO_2$. In the inorganic barrier layer, "metals" may be replaced by "nonmetals".

The inorganic barrier layer and the organic barrier layer may be deposited by a vacuum process, for example, sputtering, chemical vapor deposition, plasma chemical vapor deposition, evaporation, sublimation, electron cyclotron resonance-plasma enhanced chemical vapor deposition, or combinations thereof.

The organic barrier layer can secure the aforementioned properties. Thus, when the organic barrier layer and the inorganic barrier layer are alternately deposited, the organic barrier layer can secure smoothness of the inorganic barrier layer. In addition, the organic barrier layer can prevent defects of one inorganic barrier layer from spreading to other inorganic barrier layers.

The barrier stack may include any number of organic and inorganic barrier layers. Combination of the organic and inorganic barrier layers may vary with a level of permeation resistance to oxygen, moisture, water vapor and/or chemicals.

In the barrier stack, the organic barrier layer and the inorganic barrier layer may be alternately deposited. This is because the organic barrier layer affects the inorganic barrier layer due to the properties of the photocurable composition. Accordingly, the organic barrier layer can supplement or reinforce encapsulation of an apparatus by the inorganic barrier layer.

For example, each of the inorganic and organic barrier layers may be alternately deposited to be composed of two or more layers, wherein the number of times of deposition may be about 10 or less (for example, about 2 to 10 times), preferably about 7 or less (for example, about 2 to 7 times).

In the barrier stack, each organic barrier layer may have a thickness of about 0.1 μm to about 20 μm, for example, about 1 μm to about 10 μm, and each inorganic barrier layer may have a thickness of about 5 nm to about 500 nm, for example, about 5 nm to about 200 nm.

The barrier stack is a thin encapsulating film, and may have a thickness of about 5 μm or less, preferably about 1.5 μm to about 5 μm.

In accordance with yet another aspect of the present invention, an encapsulated apparatus may include a member for the apparatus and the barrier layers or the barrier stack. The apparatus is not limited so long as the apparatus includes the member for an apparatus as set forth above. For example, the apparatus may include displays.

FIGS. 1 and 2 are respectively cross-sectional views of encapsulated apparatuses according to embodiments of the present invention. Referring to FIG. 1, the encapsulated apparatus 100 includes a substrate 10; a member for the apparatus (for example, an organic light emitting diode) 20 formed on the substrate 10; and a barrier stack 30 including an inorganic barrier layer 31 and an organic barrier layer 32 and formed on the member for the apparatus 20.

Referring to FIG. 2, the encapsulated apparatus 200 includes a substrate 10; a member for the apparatus (for example, an organic light emitting diode) 20 formed on the substrate 10; and a barrier stack 30 including an inorganic barrier layer 31 and an organic barrier layer 32 and formed on the member for the apparatus 20.

FIG. 1 shows an embodiment in which the member for the apparatus 20 and the inorganic barrier layer 31 adjoin each other, and FIG. 2 shows an embodiment in which an empty space 40 is formed between the member for the apparatus 20 and the inorganic barrier layer 31.

Details of the member for the apparatus, the organic barrier layer, the inorganic barrier layer, and the barrier stack are the same as described above.

The substrate is not particularly limited so long as the member for the apparatus can be stacked on the substrate. For example, the substrate may be formed of a material, such as transparent glass, a plastic sheet, a silicone, or a metal substrate.

The substrate may not be included depending upon the kind of the member for the apparatus.

The encapsulated apparatus may be prepared by any typical method. The member for the apparatus is formed on the substrate, followed by forming the inorganic barrier layer on the member for the apparatus. The photocurable composition is coated by spin coating, slit coating, or the like, followed by UV irradiation to form the organic barrier layer. The procedure of forming the inorganic and organic barrier layers may be repeated.

Although not particularly limited, a method of forming the inorganic and organic barrier layers may include deposition.

In one embodiment, the encapsulated apparatus is an organic electroluminescent display and includes a substrate, an organic light emitting diode formed on the substrate, an inorganic barrier layer encapsulating the organic light emitting diode, and an organic barrier layer stacked on the inorganic barrier layer, wherein the organic barrier layer has an adhesive strength to the inorganic barrier layer of about 20 kgf/(mm)$^2$ to about 100 kgf/(mm)$^2$.

In accordance with a yet further aspect of the present invention, a method of encapsulating a member for an apparatus includes: stacking one or more members for an apparatus on a substrate; and forming one or more barrier stacks including one or more inorganic barrier layers and organic barrier layers and adjoining the member for an apparatus.

Details of the substrate, the member for an apparatus, the inorganic barrier layer, the organic barrier layer, and the barrier stack are the same as described above.

The member for an apparatus is stacked on the substrate. This may be performed using the same method as in formation of inorganic and organic barrier layers, without being limited thereto.

The inorganic barrier layer and the organic barrier layer may be formed by a vacuum process, for example, sputtering, chemical vapor deposition, plasma chemical vapor deposition, evaporation, sublimation, electron cyclotron resonance-plasma enhanced chemical vapor deposition, or combinations thereof.

MODE FOR INVENTION

Hereinafter, the present invention will be described in more detail with reference to some examples. However, it should be understood that these examples are provided for illustration only and are not to be in any way construed as limiting the present invention.

PREPARATIVE EXAMPLE 1

Preparation of Monomer Containing Heterocycle

In a 1000 ml flask provided with a cooling tube and a stirrer, 50 g of α-hydroxy-γ-butyrolactone (TCI Co., Ltd.) and 79.79 g of 2-isocyanatoethyl methacrylate were stirred at 0° C. while slowly adding 100 mg of dibutyltin dilaurate thereto. The flask was heated to 50° C., followed by stirring for 4 hours, 120 g of a compound represented by Formula 2 (HPLC purity: 97%) was obtained.

<Formula 2>

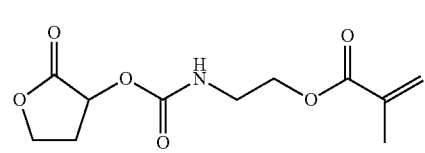

PREPARATIVE EXAMPLES 2 to 5

Preparation of Monomer Containing Heterocycle

Compounds represented by Formulas 3 to 6 were prepared in the same manner as in Preparative Example 1, except that 1-(2-hydroxyethyl)-2-pyrrolidone, N-hydroxyethyl morpholine, N-hydroxyethyl phthalimide, and N-hydroxyethyl succinimide were used in Preparative Examples 2, 3, 4 and 5, respectively, instead of α-hydroxy-γ-butyrolactone.

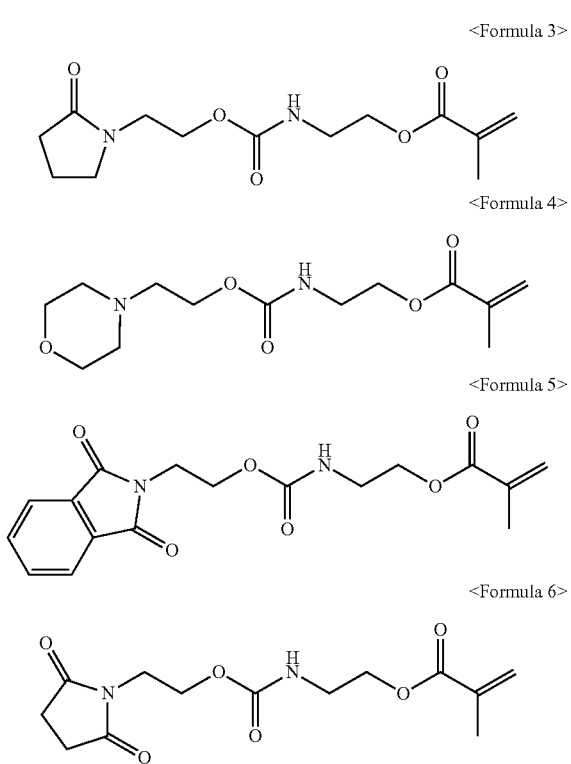

<Formula 3>
<Formula 4>
<Formula 5>
<Formula 6>

Details of components used in Examples and Comparative Examples are as follows:

(A) Photocurable monomer: (A1) Hexyl acrylate, (A2) Decanediol diacrylate, (A3) Pentaerythritol tetraacrylate (Aldrich Chemical)

(B) Monomer containing heterocycle: (B1) Monomer represented by Formula 2, (B2) Monomer represented by Formula 3, (B3) Monomer represented by Formula 4, (B4) Monomer represented by Formula 5, (B5) Monomer represented by Formula 6

(C) Initiator: Darocur TPO (BASF Co., Ltd.)

Examples 1 to 10 and Comparative Examples 1 to 3

In a 125 ml brown polypropylene bottle, (A), (B), and (C) were placed in amounts as listed in Table 1 (unit: parts by weight, in terms of solid content), followed by mixing for 3 hours using a shaker, thereby preparing photocurable compositions of Examples and Comparative Examples.

TABLE 1

|   |    | Example |    |    |    |    |    |    |    |    |    | Comparative Example |    |    |
|---|----|----|----|----|----|----|----|----|----|----|----|----|----|----|
|   |    | 1  | 2  | 3  | 4  | 5  | 6  | 7  | 8  | 9  | 10 | 1  | 2  | 3  |
| A | A1 | 20 | 20 | 20 | 20 | 20 | 20 | 20 | 20 | 20 | 20 | 20 | 20 | 20 |
|   | A2 | 65 | 65 | 65 | 65 | 65 | 60 | 60 | 60 | 60 | 60 | 75 | 70 | 65 |
|   | A3 | —  | —  | —  | —  | —  | 5  | 5  | 5  | 5  | 5  | —  | 5  | 10 |
| B | B1 | 10 | —  | —  | —  | —  | 10 | —  | —  | —  | —  | —  | —  | —  |
|   | B2 | —  | 10 | —  | —  | —  | —  | 10 | —  | —  | —  | —  | —  | —  |
|   | B3 | —  | —  | 10 | —  | —  | —  | —  | 10 | —  | —  | —  | —  | —  |
|   | B4 | —  | —  | —  | 10 | —  | —  | —  | —  | 10 | —  | —  | —  | —  |
|   | B5 | —  | —  | —  | —  | 10 | —  | —  | —  | —  | 10 | —  | —  | —  |
| C |    | 5  | 5  | 5  | 5  | 5  | 5  | 5  | 5  | 5  | 5  | 5  | 5  | 5  |

Each of the photocurable compositions prepared in Examples and Comparative Examples was evaluated as to the following properties. Results are shown in Table 2.

1. Die shear strength 1 (adhesive strength) (kgf/(mm)$^2$): Adhesive strength between glass substrates was measured in the same manner as in measurement of die shear strength. Using a Dage series 4000PXY adhesive force measurement instrument, a force of 200 kgf/mm was applied at 25° C. to an upper glass substrate from a lateral side thereof to measure detachment force. A lower glass substrate had a size of 2 cm×2 cm×1 mm (width×length×thickness), the upper glass substrate had a size of 1.5 cm×1.5 cm×1 mm (width×length×thickness), and an adhesive layer had a thickness of 500 μm.

2. Die shear strength 2 (adhesive strength) (kgf/(mm)$^2$): Adhesive strength between silicon nitride layers was measured in the same manner as in measurement of die shear strength. Using a Dage series 4000PXY adhesive force measurement instrument, a force of 200 kgf/mm was applied at 25° C. to an upper glass substrate from a lateral side thereof to measure detachment force. A lower glass substrate had a size of 2 cm×2 cm×1 mm (width×length×thickness), the upper glass substrate had a size of 1.5 cm×1.5 cm×1 mm (width×length×thickness), and an adhesive layer had a thickness of 500 μm. Both the upper and lower glass substrates were coated with silicon nitride.

3. Visible light transmittance (%): The composition was coated onto a cleaned glass substrate to a thickness of about 10 μm±2 μm, followed by UV curing (100 mW/cm$^{2\times 10}$ seconds), thereby preparing a film (thickness: 9 μm±2 μm). Light transmittance of the prepared film in the visible range of 550 nm was measured using a spectrometer (Lambda 950, Perkin Elmer Co., Ltd.).

4. Photocuring rate (%): The photocurable composition was measured as to intensity of absorption peaks in the vicinity of 1635 cm$^{-1}$ (C=C) and 1720 cm$^{-1}$ (C=O) using an FT-IR spectrometer (NICOLET 4700, Thermo Co., Ltd.). The photocurable composition was spray-coated onto a glass substrate, followed by UV curing through UV irradiation at 100 J/cm$^2$ for 10 seconds, thereby obtaining a specimen having a size of 20 cm×20 cm×3 μm (width×length×thickness). Then, the cured film was aliquoted, and the intensity of absorption peaks of the cured film was measured in the vicinity of 1635 cm$^{-1}$ (C=C) and 1720 cm$^{-1}$ (C=O) using an FT-IR spectrometer (NICOLET 4700, Thermo Co., Ltd.). Photocuring rate was calculated by Equation 1:

$$\text{Photocuring rate (\%)} = |1-(A/B)| \times 100 \qquad \text{<Equation 1>}$$

(wherein A is a ratio of the intensity of an absorption peak in the vicinity of 1635 cm$^{-1}$ to the intensity of an absorption peak in the vicinity of 1720 cm$^{-1}$ measured for the cured film, and B is a ratio of the intensity of an absorption peak in the vicinity of 1635 cm$^{-1}$ to the intensity of an absorption peak in the vicinity of 1720 cm$^{-1}$ measured for the photocurable composition).

TABLE 2

| | Example | | | | | | | | | | Comparative Example | | |
|---|---|---|---|---|---|---|---|---|---|---|---|---|---|
| | 1 | 2 | 3 | 4 | 5 | 6 | 7 | 8 | 9 | 10 | 1 | 2 | 3 |
| Die shear strength 1 (kgf/(mm)$^2$) | 38.5 | 32.5 | 33.8 | 36.5 | 35.2 | 42.5 | 36.5 | 37.1 | 40.2 | 38.5 | 11 | 13.5 | 15 |
| Die shear strength 2 (kgf/(mm)$^2$) | 28.4 | 31.8 | 29.2 | 35.2 | 31.5 | 32.5 | 33.2 | 30.1 | 37.6 | 35.5 | 9.6 | 12.5 | 13.8 |
| Visible light transmittance (%) | 96.1 | 95.4 | 95.8 | 95.1 | 96.5 | 95.8 | 95.3 | 95.1 | 95.8 | 95.9 | 96.3 | 95.3 | 95.1 |
| Photocuring rate (%) | 96.2 | 94.4 | 93.1 | 92.5 | 91.5 | 96.5 | 95.4 | 94.2 | 94.3 | 92.5 | 83 | 87.5 | 89.2 |

As can be seen from Table 2. the photocurable composition according to the present invention exhibited excellent adhesion to an inorganic barrier layer including glass, silicon nitride, or the like and high photocuring rate, and thus could realize a barrier layer having high reliability.

Conversely, the photocurable compositions of Comparative Examples 1 to 3 not including the monomer containing heterocycle exhibited poor adhesion to the inorganic barrier layer and low photocuring rate, and could not realize effects of the present invention.

It should be understood that the present invention is not limited to the above embodiments and the accompanying drawings and that various modifications, variations, and alterations can be made by those skilled in the art without departing from the spirit and scope of the present invention. Therefore, it should be understood that these embodiments and the accompanying drawings are given by way of illustration only and are not to be construed in any way as limiting the present invention.

The invention claimed is:

1. A photocurable composition for encapsulating organic light emitting diodes, the photocurable composition being capable of being cured such that the resulting cured product has a visible light transmittance of at least 95%, the photocurable composition comprising: (A) a photocurable monomer and (B) a monomer represented by Formula 1:

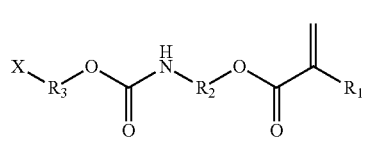

<Formula 1> wherein, in Formula 1,
R$_1$ is hydrogen or a substituted or unsubstituted C$_1$ to C$_{20}$ alkyl group,
R$_2$ is an unsubstituted C$_1$ to C$_{30}$ alkylene group, a substituted or unsubstituted C$_6$ to C$_{30}$ arylene group, or a substituted or unsubstituted C$_5$ to C$_{20}$ cycloalkylene group,
R$_3$ is a single bond, a substituted or unsubstituted C$_1$ to C$_{30}$ alkylene group, a substituted or unsubstituted C$_6$ to C$_{30}$ arylene group, or a substituted or unsubstituted C$_5$ to C$_{20}$ cycloalkylene group, and
X is a lactone group, a morpholine group, a phthalimide group, or a succinimide group wherein:
the photocurable monomer includes a mixture of a monofunctional (meth)acrylate monomer and a polyfunctional (meth)acrylate monomer, and in the mixture, the monofunctional (meth)acrylate monomer and the polyfunctional (meth)acrylate monomer are present in a weight ratio of about 1:2 to about 1:7, and
the composition includes the photocurable monomer and the monomer represented by Formula 1 in a combined amount that is at least 95 wt % of the composition.

2. The photocurable composition according to claim 1, wherein the (B) monomer is represented by any one of Formulas 2, 4, 5, or 6:

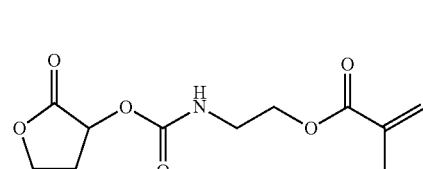

<Formula 2>

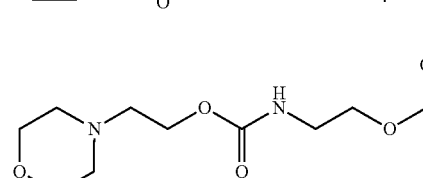

<Formula 4>

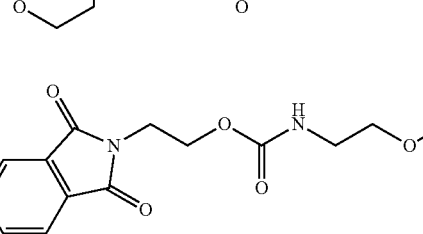

<Formula 5>

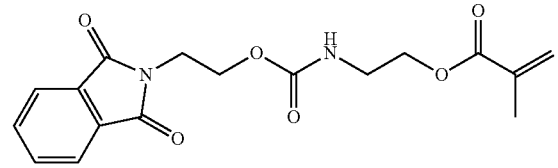

<Formula 6>

3. The photocurable composition according to claim 1, wherein the (A) photocurable monomer includes a photocurable monomer containing about 1 to 30 vinyl groups, 1 to 30 acrylate groups, or 1 to 30 methacrylate groups.

4. The photocurable composition according to claim 1, wherein the (A) photocurable monomer includes a (meth)

acrylate containing a $C_1$ to $C_{20}$ alkyl group, and at least one of a di(meth)acrylate of a $C_2$ to $C_{20}$ diol, a tri(meth)acrylate of a C3 to C20 triol, and a tetra(meth)acrylate of a C4 to C20 tetraol.

5. The photocurable composition according to claim 1, further comprising: (C) an initiator.

6. The photocurable composition according to claim 5, wherein the (C) initiator includes a photo initiator.

7. The photocurable composition according to claim 5, wherein the photocurable composition includes about 0.1wt % to 5 wt % of the (C) initiator, in terms of solid content.

8. A barrier layer comprising a cured product of the photocurable composition according to claim 1.

9. An encapsulated apparatus, comprising:
a member; and
a barrier stack on the member, the barrier stack including an inorganic barrier layer and an organic barrier layer, wherein the organic barrier layer includes a cured product of the photocurable composition according to claim 1.

10. The encapsulated apparatus according to claim 9, wherein the organic barrier layer has an adhesive strength to the inorganic barrier layer of about 20 $kgf/(mm)^2$ to about 100 $kgf/(mm)^2$.

11. The encapsulated apparatus according to claim 9, wherein: the inorganic barrier layer includes a metal, a metal oxide, a metal nitride, a metal carbide, a metal oxynitride, a metal oxyboride, or a mixture thereof, the metal including at least one of silicon (Si), aluminum (Al), selenium (Se), zinc (Zn), antimony (Sb), indium (In), germanium (Ge), tin (Sn), bismuth (Bi), a transition metal, and a lanthanide metal.

12. The encapsulated apparatus according to claim 9, wherein:
the barrier stack includes a plurality of the organic barrier layer and a plurality of the inorganic barrier layer,
each organic barrier layer has a thickness of about 0.1 μm to about 20 μm, and
each inorganic barrier layer has a thickness of about 5 nm to about 500 nm.

13. The encapsulated apparatus according to claim 9, wherein the member is a flexible organic light emitting device, an organic light emitting device, an illumination device, a metal sensor pad, a microdisc laser, an electrochromic device, a photochromic device, a microelectromechanical system, a solar cell, an integrated circuits circuit, a charge coupled device, a light emitting polymer, or a light emitting diode.

* * * * *